(12) United States Patent
Stollenwerk et al.

(10) Patent No.: US 6,623,607 B1
(45) Date of Patent: Sep. 23, 2003

(54) SUBSTRATE COATED WITH AN MGO-LAYER

(75) Inventors: Johannes Stollenwerk, Gelnhausen (DE); Christoph Daube, Alzenau (DE); Achim Gürke, Aschaffenburg (DE)

(73) Assignee: Balzers Hochvakuum AG, Trubbach (CH)

( * ) Notice: Subject to any disclaimer, the term of this patent is extended or adjusted under 35 U.S.C. 154(b) by 0 days.

(21) Appl. No.: 08/985,880

(22) Filed: Dec. 5, 1997

(30) Foreign Application Priority Data

Nov. 20, 1997 (EP) .............................................. 97120354

(51) Int. Cl.[7] .............................................. C23C 14/34
(52) U.S. Cl. ............................ 204/192.15; 204/192.15; 204/192.13
(58) Field of Search ................... 204/298.12, 298.13, 204/298.26, 298.07, 192.15, 192.12, 298.14, 298.06, 192.13, 298.03, 298.23, 298.24

(56) References Cited

U.S. PATENT DOCUMENTS

| | | | | |
|---|---|---|---|---|
| 4,336,119 A | * | 6/1982 | Gillery | 204/192.13 |
| 4,407,709 A | * | 10/1983 | Enjouji et al. | 204/192.13 |
| 4,946,576 A | * | 8/1990 | Dietrich et al. | 204/192.12 |
| 5,069,770 A | * | 12/1991 | Glocker | 204/298.07 |
| 5,147,498 A | * | 9/1992 | Nashimoto | 204/192.13 |

FOREIGN PATENT DOCUMENTS

| | | | | |
|---|---|---|---|---|
| CH | 0803587 | | 7/1997 | |
| DE | 2350322 A | * | 4/1975 | 204/298.12 |
| GB | 0570182 | | 5/1993 | |
| JP | 63-219579 A | * | 9/1988 | 204/298.12 |
| JP | 01 234 398 | * | 9/1989 | 204/192.15 |
| JP | 2-225663 A | * | 9/1990 | 204/298.07 |
| JP | 4-263066 A | * | 9/1992 | 204/298.12 |
| JP | 5-070945 A | * | 3/1993 | 204/298.12 |
| JP | 5-230640 A | * | 9/1993 | 204/298.07 |
| JP | 5-320891 A | * | 12/1993 | 204/298.07 |

OTHER PUBLICATIONS

"Elements of X–ray Crystallography", Azároff, pp. 365.
Kohlrausch, pp. 750–753.
Cullity, pp. 188–189.
Atsushi, Production of Thin Oxide Film, Dec. 13, 1989, PAJ, vol. 13 No. 562 (cc–665).
Kaneko, et al., Preparation of MgO Thin Films by RF Magnetron.
Bruley, et al., "Nanostructure and chemistry of a (100) MgO/(100) GaAs interface", Aug. 1, 1994, APL, vol. 65, No. 5.
Ishihara, et al., "Structure of MgO Films Prepared by Ion Beam Sputtering", Aug. 1, 1989, JCSP, IE, vol. 97, No8.

* cited by examiner

Primary Examiner—Patrick Ryan
Assistant Examiner—Gregg Cantelmo
(74) Attorney, Agent, or Firm—Notaro & Michalos P.C.

(57) ABSTRACT

A method and apparatus for producing a substrate which is coated with a Mgo-layer, includes a pair of Mg targets which define a slit and which have a target purity of at least 99 percent. A working gas flows along the slit. Oxygen is provided in an area between the slit and the substrate to be coated. The temperature of the substrate is set by heating or cooling the substrate during the coating process.

24 Claims, 10 Drawing Sheets

SUBSTRATE COATED WITH AN MGO-LAYER

The present invention is directed to a substrate which is coated with at least one layer of Magnesium-Oxide, i.e. of MgO, and which has an extent of at least 100 mm×100 mm. Further, the present invention is directed to a method for manufacturing a coated substrate and especially for manufacturing a substrate which is coated with at least one MgO-layer and which has an extent of at least 100 mm×100 mm.

Further, the present invention is directed to a coating apparatus for MgO coating planar substrates with an extent of at least 100 mm to 100 mm.

PRIOR ART

It is known to coat relatively large surface substrates, as especially substrates for Plasma Display Panels (PDP), by means of electron beam evaporation with high quality MgO-layers. The high quality is e.g. guaranteed by the fact that the density of the deposited layer material, compared with the density ρ of MgO-bulk material, which is ρ=3.58 g/cm3, is very high, namely between 85% and 95% of the bulk material density ρ.

DEFINITIONS

In the following, the term "Θ-2Θ-method" is used.

This method is known from F. Kohlrausch, Praktische Physik, vol. 2, 23rd edition, p. 753, B. G. Teubner, Stuttgart 1985, and from Leonid V. Azaroff, "Elements of X-Ray Crystallography", McGraw-Hill Book Company, New York, St. Louis, San Francisco, Toronto, London, Sydney, pp. 366–367.

Attention is further drawn to "Elements of X-Ray Diffraction", 2nd edition, B. D. Cullity, Addison-Wesley Publishing Company, Inc., Reading, Massachusetts, pp. 188–189.

The mentioned method resides on the "Bragg method" and is based on rotation of the crystal by an angle Θ coupled to a rotation of a detector by an angle of 2Θ and is thus named "Θ-2Θ"-method.

If, in the present application, we talk of a "peak at (xyz)" we refer to a peak in the measuring diagram of the Θ-2Θ-method which is present according to a (xyz) orientation of the crystals as is customary in the art of crystallography.

If we refer to a "predominant peak" we refer to such a peak in the Θ2Θ-method measuring diagram which is higher than all other peaks in that diagram.

If we refer to the presence of a single peak in said diagram, it is automatically understood that peaks of higher order are present too. Thus, if we speak of a single peak at (111), we automatically understand that there is a second order peak present at (222).

The coating material which is deposited by electron beam evaporation has the significant drawback that it shows no predominant peak when examined by the Θ-2Θ-method.

SUMMARY OF THE INVENTION

The present invention proposes a substrate which is coated with at least one MgO-layer and which has an extent of at least 100 mm×100 mm wherein the layer has a predominant peak in the resulting diagram of the Θ-2Θ-method. Especially if such an inventive substrate is a PDP-substrate, it is often very advantageous that the layer of this substrate has such predominant peak at (111) or has even exclusively a peak at (111). Manufacturing of such substrates is not possible by means of electron beam evaporation.

Further, and instead of a predominant peak at (111), a predominant peak may be realized at another, (xyz), angular location or, additionally to a predominant peak at (111), further peaks at other (xyz) angular locations may be present. Especially such a peak may be present at (200) and/or at (220) as predominant peak or as additional peaks.

In a preferred embodiment of the inventive substrate, the MgO-layer has an index of refraction n for which there is valid $1.6 \leq n \leq 1.8$ for light in a spectral range of at least 400 nm to 800 nm or even preferably in a range of 350 nm to 820 nm.

In a further preferred embodiment, the index of refraction n in the said spectral range is $1.6 \leq n \leq 1.75$ or even $1.65 \leq n \leq 1.7$ In a further preferred embodiment of the present invention the inventive substrate has a homogeneous surface roughness of the layer which is preferably between 0.2 nm RMS and 0.5 nm RMS measured by means of AFM (Atomic Force Microscopy).

Although the inventive substrate has, based on the inventively provided predominant peak, advantages compared with such substrates realized customarily, the inventive substrate has further and preferably a density of the layer material which is at least 85% or even at least 90% of the density ρ of stoichiometric MgO-bulk material. As was mentioned above, the density of MgO-bulk material is ρ=3.58 g/cm3.

In a preferred embodiment, the inventive substrate has a layer wherein the MgO-material is stoichiometric.

It is further inventively proposed a method for producing a substrate, thereby preferably a substrate with at least one MgO-layer, and which has an extent of 100 mm×100 mm, which layer shows at least one predominant peak in the measuring course of the Θ-2Θ-method.

Such a method comprises the steps of flowing a working gas through at least one slit defined between two sputter-targets made of Mg towards a substrate which substrate is distant from an end-area of the slit, thereby selecting the purity of the Mg-target material to be at least 99%, and of introducing oxygen into the area between said end area of said slit and the substrate and further predetermining the substrate temperature prevailing during the coating process.

Thereby it becomes possible to realize the inventive substrate with a high coating rate, due to the inventively proposed reactive sputter coating and further with high degree of target material exploitation. Thus, it becomes possible to manufacture the inventive substrates industrially and in a very economical manner.

The mentioned large areal substrates may be produced at relatively low costs and at high throughputs industrially.

An inventive and preferred coating arrangement for preferably performing the inventive method is proposed which comprises:

two Mg-targets mutually defining a slit and made of Mg-material with a purity of at least 99%;

at a first end area of the slit an anode arrangement and a gas feed arrangement connected to a gas tank arrangement containing a working gas;

a substrate carrier and conveyor arrangement with which a planar substrate is moved over and past said slit, distant from a second slit end area which is opposite to said first slit end area;

a further gas feed arrangement acting into the space between said second slit end area and said substrate carrier and conveyor arrangement, which further gas feed arrangement being connected to a gas tank arrangement containing oxygen.

SHORT DESCRIPTION OF THE FIGURES

The invention is further described by way of examples and with the help of FIGS. These FIGS. show.

DETAILED DESCRIPTION OF THE FIGURES

Figure 1:
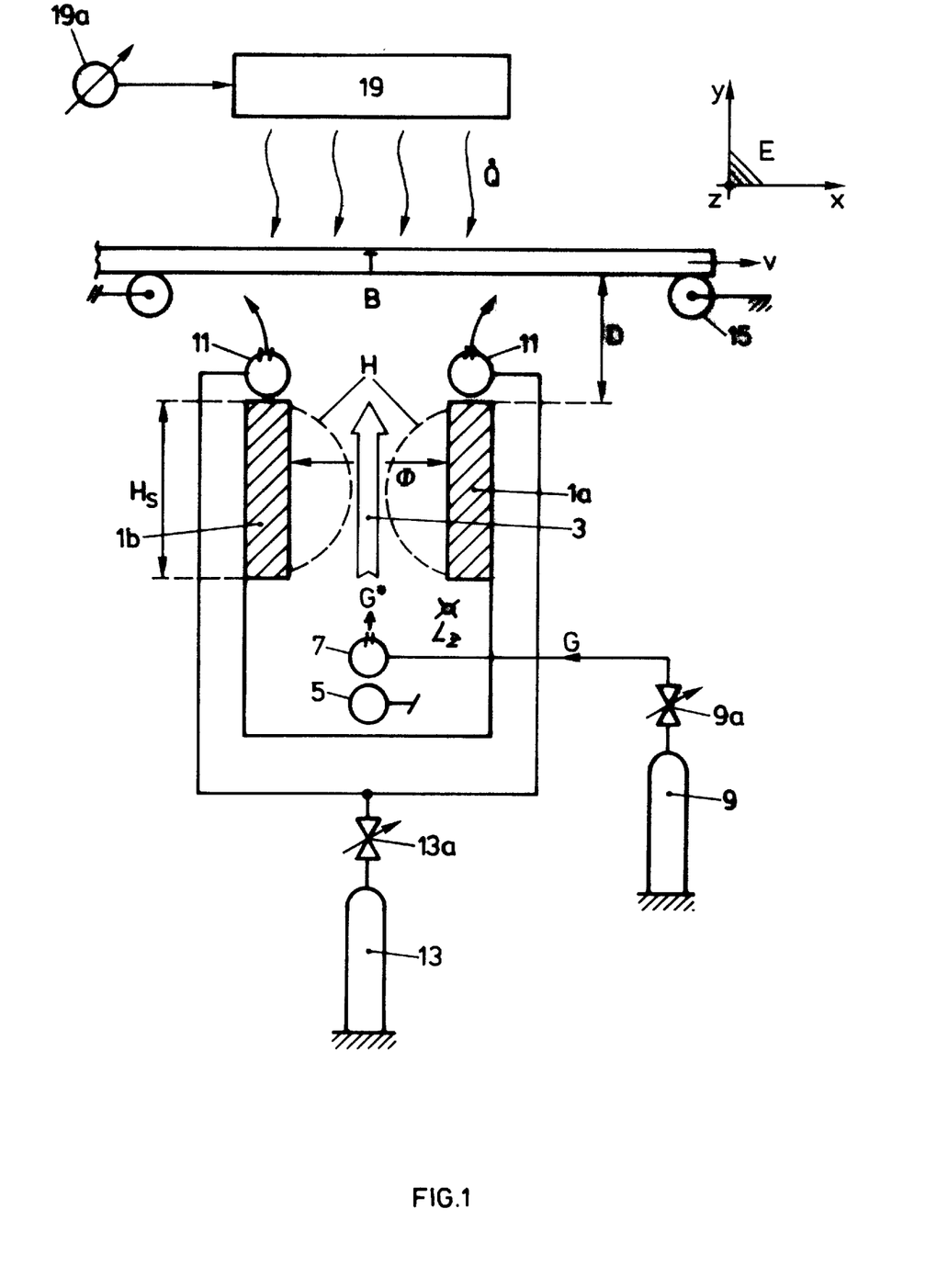
FIG. 1 schematically an inventive apparatus for performing the inventive manufacturing process and for realizing the inventive substrate.

In FIG. 1, there is schematically shown a coating apparatus which is most apt to perform the inventive method and to manufacture the inventive substrate. With respect to further apparatus, which is at least as suited as that shown in FIG. 1, we refer to the EP-0 803 587 and to its U.S. counterpart, U.S. Pat. No. 6,337,001, which is incorporated in this description by reference. The apparatus according to FIG. 1 and that as disclosed in U.S. Pat. No. 6,337,001 are referred to as "gas flow sputter source" apparatus.

Essential at such a gas flow sputter source is at least one pair of targets, $1a$ and $1b$, which mutually define a slit 3 which is, considered in Z-direction of FIG. 1, extended. Slit 3 is, according to FIG. 1, open on both sides considered in Z-direction or is, according to U.S. Pat. No. 6,337,001, closed. The extent of the slit considered in Z-direction may be, e.g., 1600 mm in both forms of realization. The targets are preferably (not shown) operated by DC generators, whereby also AC or DC with superimposed AC or pulsating DC operation is possible. In one end are of the slit 3, there is provided an anode arrangement 5, as well as a gas feed arrangement 7 which extend along slit 3. The gas feed arrangement 7 is connected via an adjusting member 9 a to a working gas tank arrangement 9 which preferably contains Argon.

At that end area of the slit which is opposed to the gas feed arrangement 7 there is provided a further gas feed arrangement 11. This further gas feed arrangement, as again schematically shown, is connected with a gas tank 13 via an adjusting member $13a$, which gas tank 13 contains oxygen. Above the end area of the slit which is provided with the oxygen gas feed arrangement 11, there is provided a substrate carrier and conveyor arrangement, as schematically shown at 15, for a planar substrate 17 with an extent of at least 100 mm×100 mm. By means of that carrier and conveyor arrangement 15, a substrate 17 is conveyed perpendicularly to the gas flow direction G of working gas through slit 3. Thereby, the substrate is moved distant from that end area of the slit which comprises the oxygen gas feed arrangement 11. The relative movement of the substrate 17 with respect to slit 3 is preferably linear and preferably constant and continuous.

At the arrangement according to FIG. 1, which has, as was mentioned, a laterally both sided open slit 3, preferably the geometric conditions and the operating parameters are selected as described in the above mentioned EP-0 803 587 and its counterpart, U.S. application Ser. No. 08/895,451.

total pressure within the coating area B: 0.1 to 10 mbar;

partial pressure $O_2$: up to 10% of the total pressure in the coating area B;

output flow of working gas G, preferably of Argon, out of the slit opening into the coating area B:

This flow is selected within the Knudsen or viscous range. There is valid:

Knudsen range:

$$10^{-2} \text{ mbar·cm} \leq p \cdot \leq \Phi \leq 0.6 \text{ mbar·cm};$$

viscous range:

$$0.6 \text{ mbar·cm} < p \cdot \Phi,$$

wherein p stands for the total pressure in slit 3 and Φ stands for the width of slit 3.

Preferably this gas flow is selected in the Knudsen range. Further, there is preferably valid:

$$10 \text{ sccm/cm}^2 \leq F \leq 200 \text{ sccm/cm}^2,$$

wherein F stands for the flow of working gas per surface area of the slit opening. Preferably there is thereby valid:

$$20 \text{ sccm/cm}^2 \leq F \leq 50 \text{ sccm/cm}^2.$$

Width of the slit, Φ, i.e. mutual distance of the targets $1a$, $1b$:

$$5 \text{ mm} \leq \Phi \leq 40 \text{ mm},$$

thereby preferably $$\Phi \leq 25 \text{ mm},$$

and especially preferred $$8 \text{ mm} \leq \Phi \leq 20 \text{ mm}.$$

Depth of the slit (target extent) $H_s$ in direction G of FIG. 1:

$$1 \text{ cm} \leq H_s \leq 20 \text{ cm},$$

slit height $L_z$: e.g. 1600 mm.

If, similar to a magnetron, tunnel shaped magnetic fields H are realized over the sputtering surfaces of the targets 1a and 1b, then preferably so that, measured parallel to the sputtering surfaces of the targets 1a and 1b and in the middle of the slit 3, there is valid:

$$150 \text{ Gauss} \leq H \leq 1200 \text{ Gauss},$$

thereby preferably $$H \geq 300 \text{ Gauss},$$

thereby especially preferred $$300 \text{ Gauss} \leq H \leq 800 \text{ Gauss}.$$

With the help of a heating and/or cooling arrangement, which is adjustable in an open loop controlled or in a negative feedback controlled manner by means of an adjusting member 19a, the substrate temperature T in the area B is set.

A coating apparatus as schematically shown in FIG. 1 was dimensioned and operated as follows:

target material 1a, 1b: Mg3N5, purity 99.95%;
target discharge voltage with respect to anode 5 on ground potential: 310 V;
discharge current: 27A;
power density per sputtering surface unit and at planar, yet unsputtered sputtering surfaces: 15W/cm²;
working gas: Ar with a flow of 8000 sccm;
reactive gas: O₂, variable flow;
total pressure in the area B: 0.4 mbar;
substrate temperature: 200° C., variable;
substrate surface area: 300×400 cm²;
dynamic deposition rate: 30–50 nm.m/mini (which results from multiplying nm as deposited thickness, and speed of the substrate in meters per minute);
substrate-to-slit end distant D: 50 mm;
moving speed of substrate over slit end v: 0.7 m/min.

This produces a static deposition rate of at least 5 nm/sec.

Figure 2:
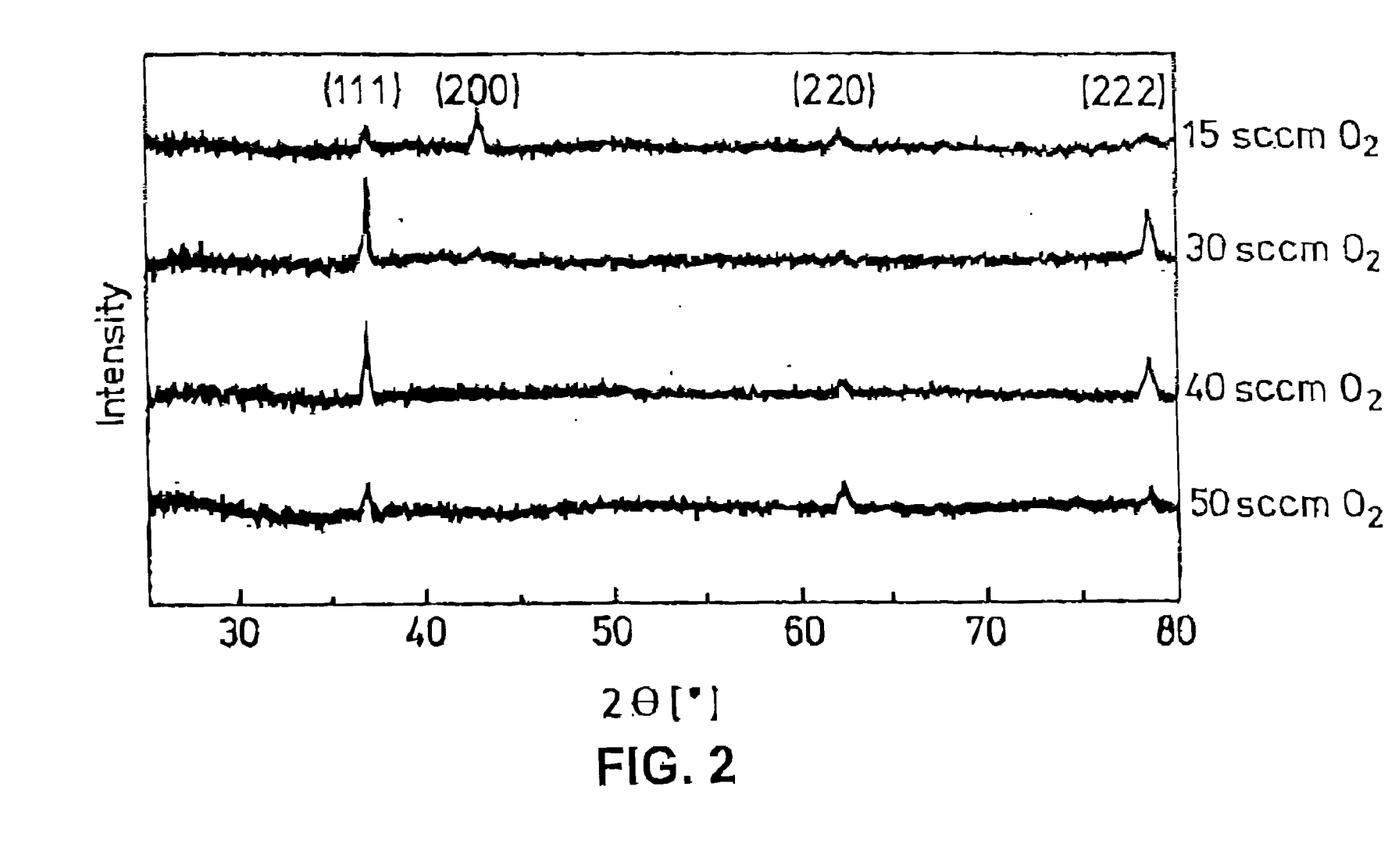
FIG. 2 the Θ-2Θ-method diagram with predominant peaks at (111) and (200) respectively of an inventive substrate produced according to the inventive method and preferably thereby with the inventive apparatus and for a varied oxygen flow.

In FIG. 2 the measuring diagram of the Φ-2Φ-method of the MgO-layer at an inventively coated PDP-glass substrate of AF 45 glass is shown. At the arrangement according to FIG. 1, the oxygen flow was varied by means of the adjusting member 13a. As is shown in FIG. 2, by means of adjusting the flow of oxygen, the height and the angular position of the resulting peak may be adjusted. For a PDP-substrate it was desired to provide exclusively a peak at (111) which was reached at an oxygen flow of 30 sccm to 40 sccm. As may be seen, the second order peak is present at (222).

It may further be seen that by adjusting the oxygen gas flow at the inventive method, the angular position and the height of the resulting peaks may be adjusted, whereby different angular positions, as e.g. at (200) and/or (220) may be set.

Figure 3:
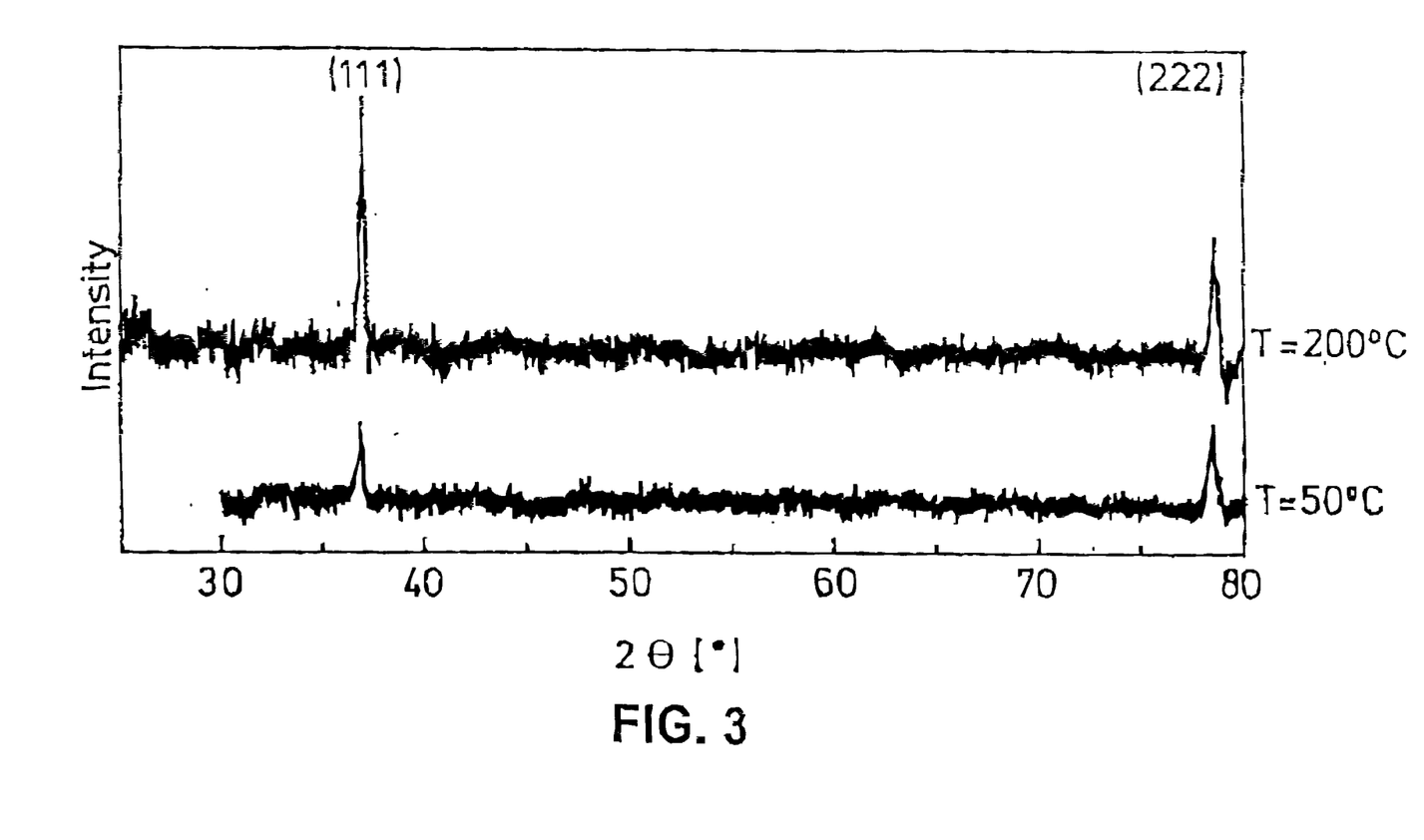
FIG. 3 in a representation in analogy to that of FIG. 2, the setting of the peaks by varying the substrate temperature T prevailing during the inventive coating.

In FIG. 3 there is shown that at the inventive production method according to FIG. 1 or at a gas flow sputter source in general, another process parameter which influences angular positions and height of the resulting peaks is the substrate temperature T prevailing during the coating process. Preferably both these parameters, i.e. oxygen flow according to FIG. 2 and substrate temperature T, are exploited for adjusting angular position and height of the resulting peaks as desired.

Figure 4:
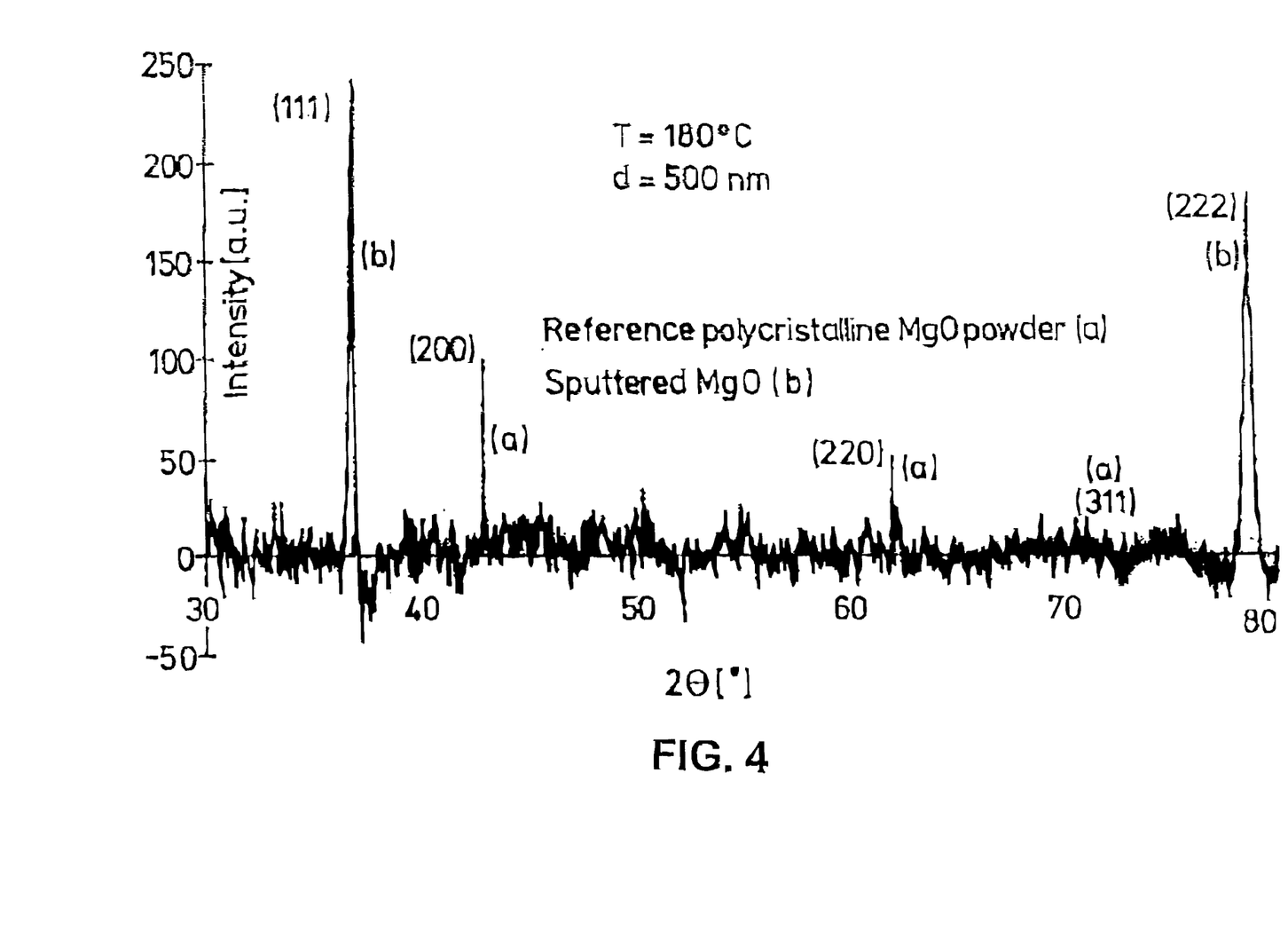
FIG. 4 in a representation in analogy to FIG. 2, the peak at an inventive substrate (b) and at a polycrystalline MgO-powder (a), latter for comparison.

In FIG. 4 there is shown the measuring diagram (b) of the Φ-2Φ-method at an inventively coated substrate, coated with a 500 nm thick MgO-layer which was deposited at a temperature T=180° C. The peaks (a) at (200), (220) and (311) are peaks resulting from measuring a polycrystalline MgO-powder and are introduced for comparison.

Figure 5:
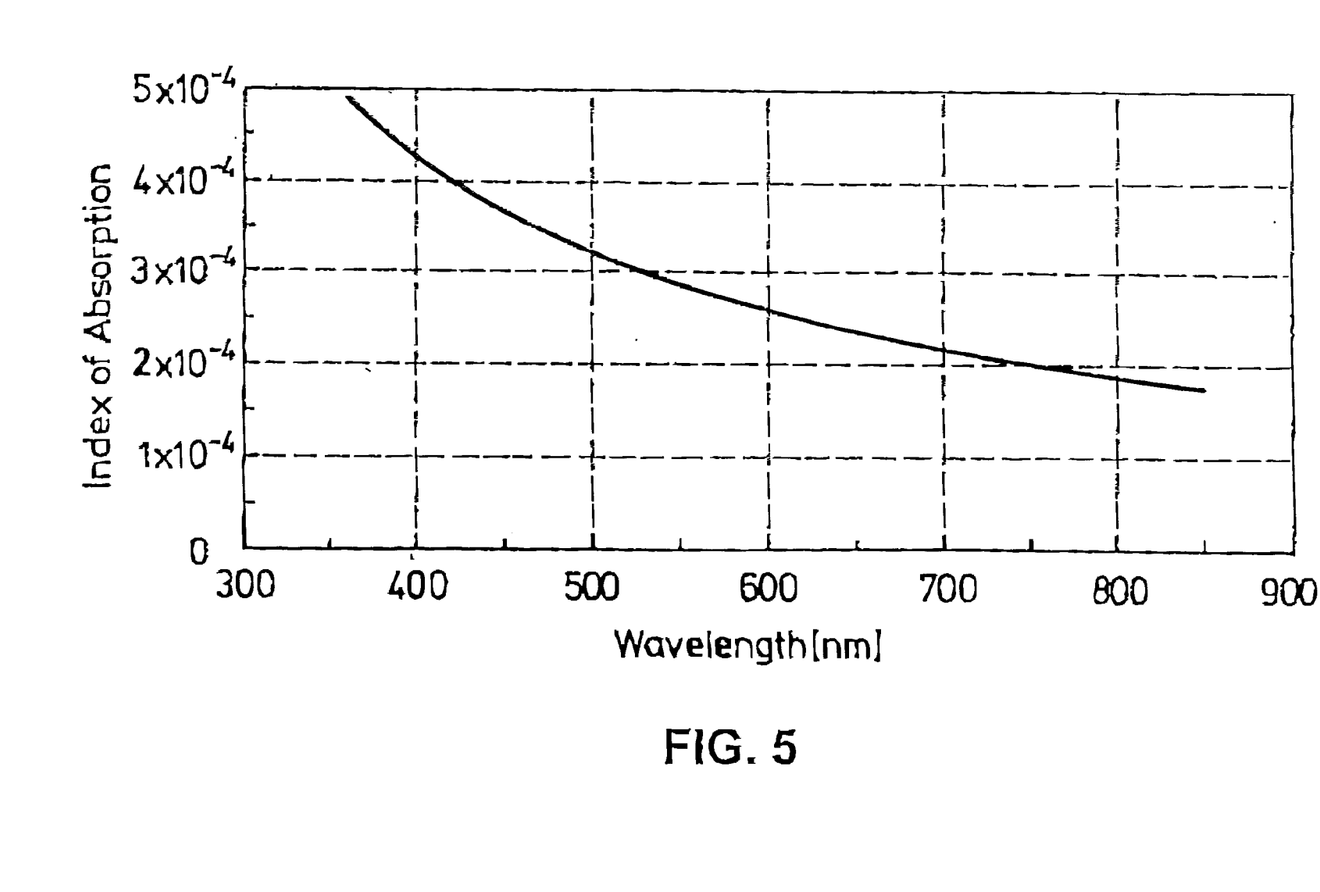
FIG. 5 the absorption coefficient as a function of wavelength of the impinging light of an inventive substrate, manufactured according to the inventive method and, preferably, with an inventive apparatus.

In FIG. 5 the variation of the extinction coefficient as a function of wavelength of impinging light is shown at the inventively manufactured inventive substrate with the deposited MgO-layer.

Figure 6:
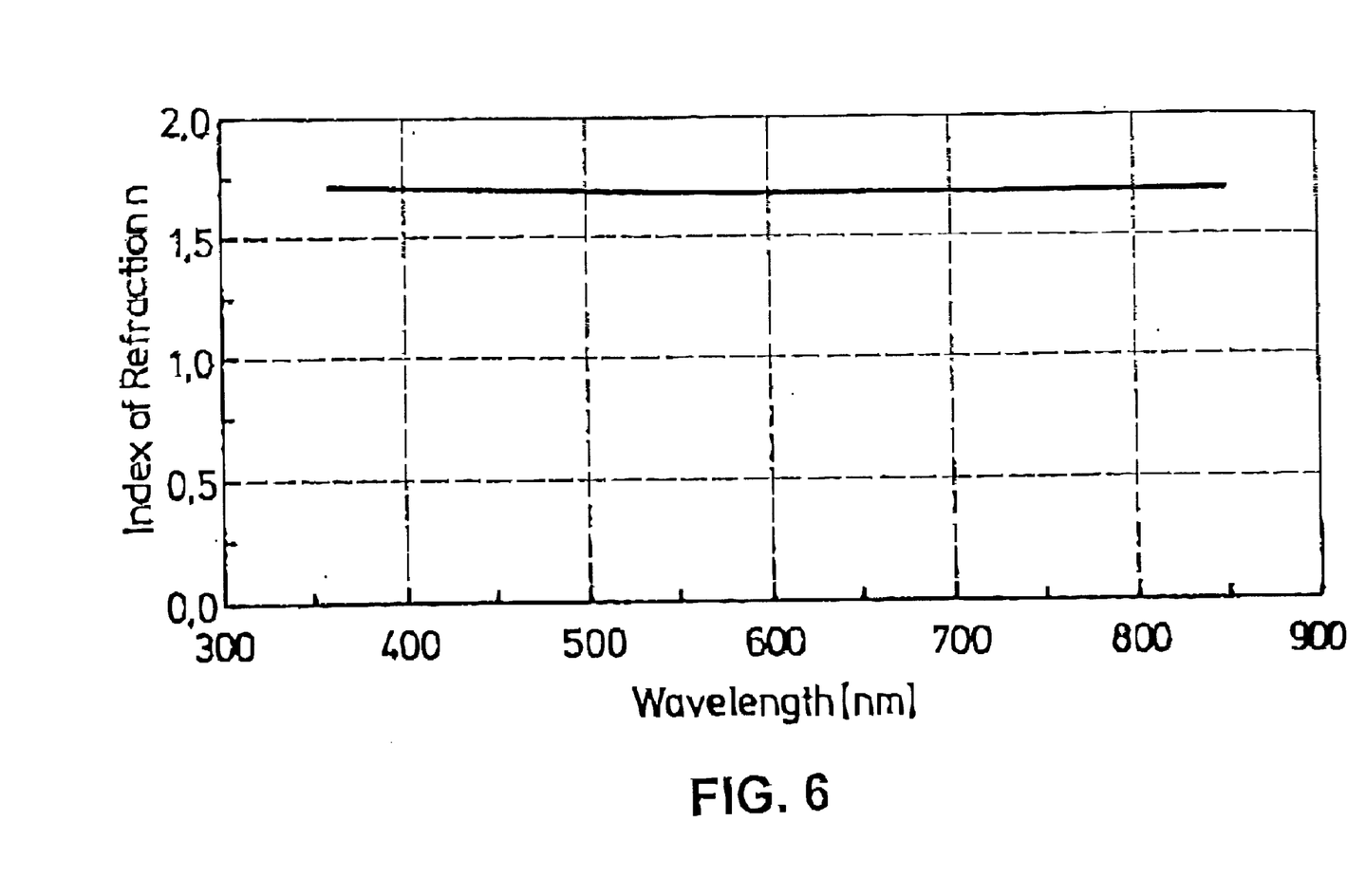
FIG. 6 the index of refraction n as a function of wavelength of the impinging light of an inventive substrate according to FIG. 5.

With well-known and, as was explained, considerably less economic deposition of high quality MgO-layers on substrates by means of electron beam evaporation, indices of refraction n are realized close to a desired value of 1.7. As may be seen from FIG. 6 at the inventively coated inventive substrate, too, the values of the index of refraction vary between 1.6 and 1.8, preferably between 1.65 and 1.75, and especially preferred, and as shown in FIG. 6, just between 1.65 and 1.7. This is valid over a spectral range of at least 400 nm to 800 nm and, according to FIG. 6, even for a range between 350 nm and 820 nm.

Figure 7:
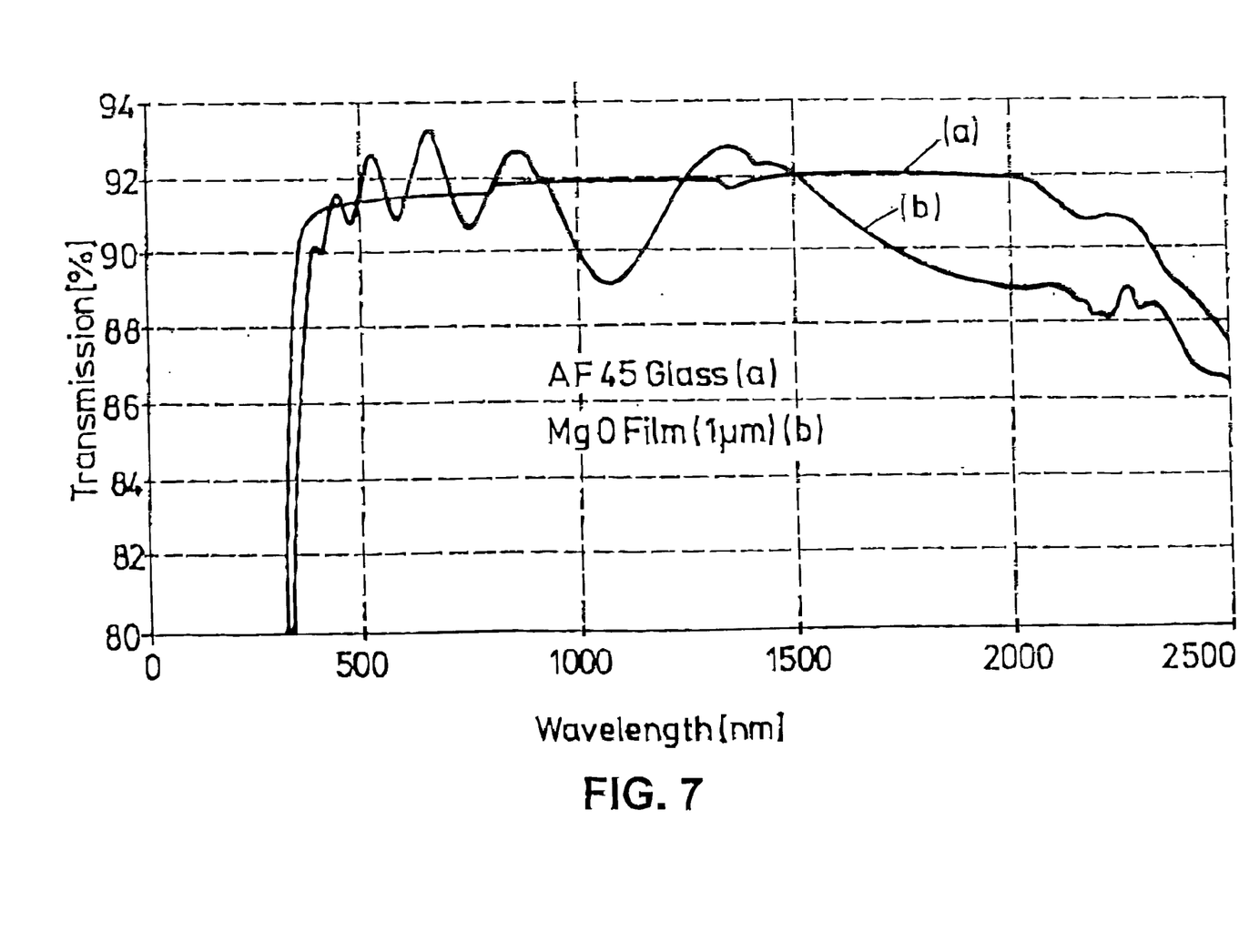
FIG. 7 the spectral transmission in percent for an AF 45 glass (a), for comparison, and of an inventive substrate which comprises AF 45 glass as carrier substrate.

In FIG. 7 there is shown in percent the transmission of uncoated AF 45 glass (a) and (b) of an inventive substrate with AF 45 glass coated with a 1 µm thick MgO-layer.

Figure 8:
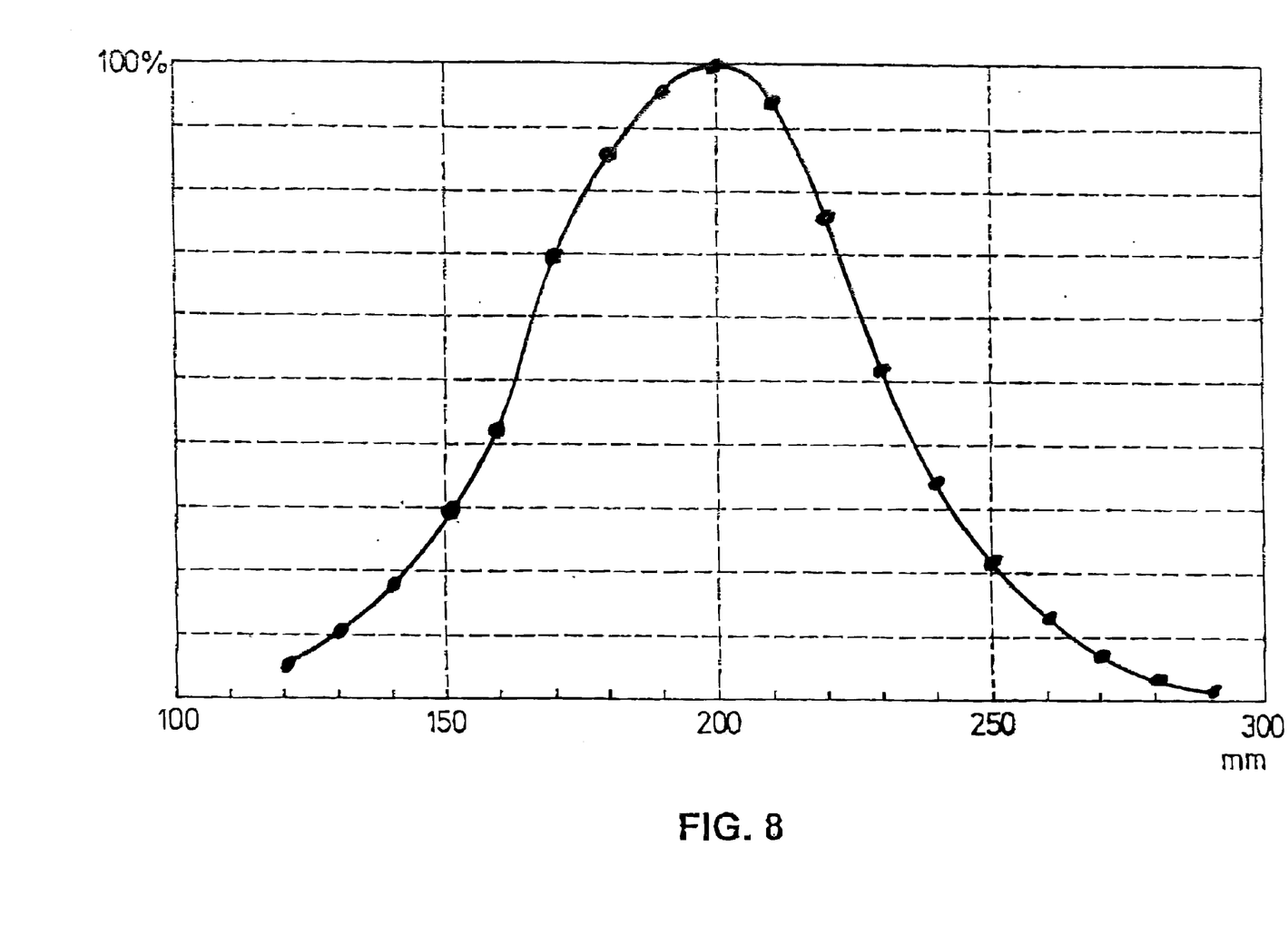
FIG. 8 along a plane E as shown in FIG. 1, the distribution of deposited layer material, whereby the substrate is kept stationary with respect to the coating source and indicated in percent of the maximum deposition thickness along the substrate.

FIG. 8 shows, looking back on the arrangement of FIG. 1, the coating rate distribution along the x-direction within the plane E when the substrate is kept stationary over the slit 3. As was mentioned, the distance between substrate and end area of the slit, D, is 50 mm.

Figure 9:
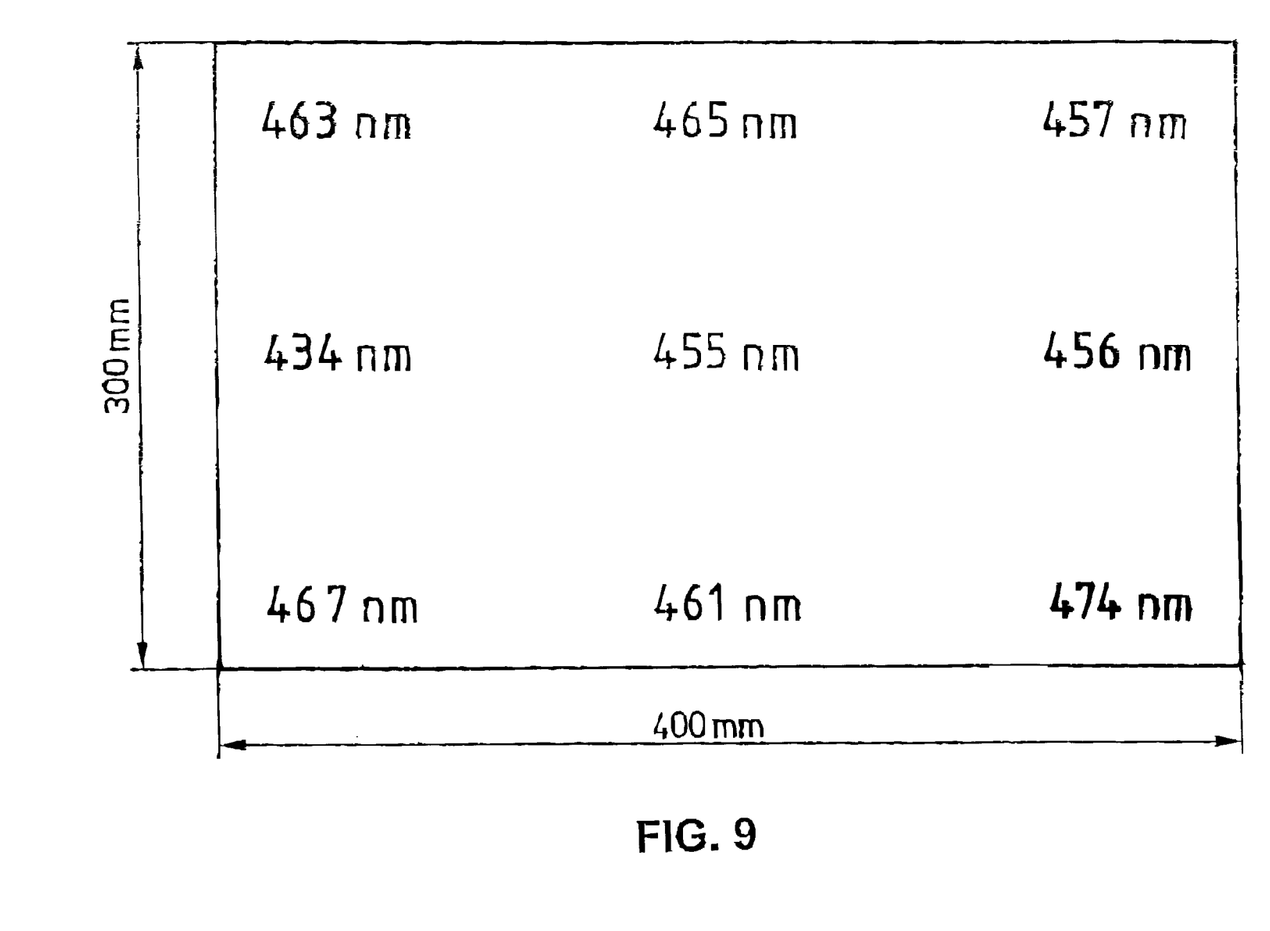
FIG. 9 on an inventive PDP-substrate, the distribution of MgO-coating thickness.

In FIG. 9 there is shown the layer thickness distribution at an inventive PDP-substrate with an extent of 300 mm×400 mm. It may be seen therefrom that the layer thickness distribution is considerably better than ±10% with respect to a layer thickness average value, and this in spite of the large extent of the substrate.

Figure 10:
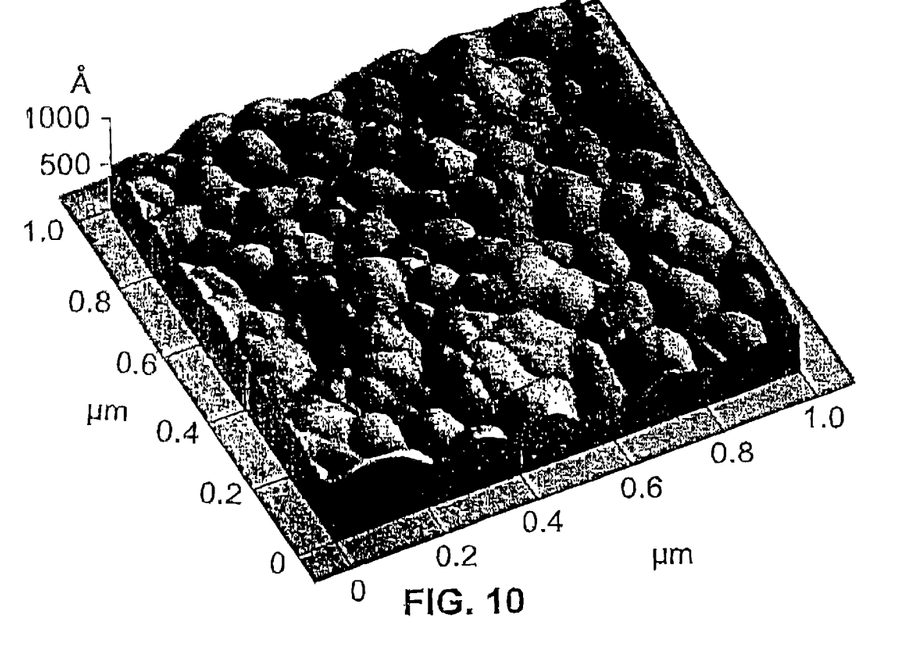
FIG. 10 at an inventive substrate, coated at a substrate temperature T=200° C., the surface roughness measured by means of Atomic Force Microscopy (AFM).

In FIG. 10 there is finally shown the surface roughness as monitored with AFM at an inventive substrate which was coated at 200° C. with the MgO-layer of a thickness of 500 nm.

At the inventive substrate, especially as realized according to the inventive method, the surface roughness may be varied in a large range, i.e. between 0.2 nm RMS and 0.5 nm RMS, as measured by AFM, especially by adjusting the coating temperature T.

By means of the inventive substrate, and especially the inventive PDP-substrate, there is provided a substrate with a predominant peak especially at (111) of the MgO-layer which further holds a high density. Such inventive substrate may be produced in a most economic manner which is most suited for industrial production. With the inventive method of manufacturing, very high dynamic deposition rates are reached, far above 30 nm.m/min which adds to economic production, additionally to the fact that by the inventive method the target material may be exploited to an extent of over 70%.

It has to be pointed out that, by means of electron beam evaporation, the material being evaporated may only be exploited to an extent of about 10%. Although up to the present moment we have not made corresponding experiments, it is largely believed that, by means of using gas flow-sputter sources as described in the EP-0 803 587 and its U.S. counterpart, according to U.S. application Ser. No. 08/895,451, even further increased deposition rates might be realizable, especially if operated with magnetron-type magnetic fields.

Further, it was shown by means of Electron Probe Micro Analysis (EPMA) that the inventively deposited MgO-layers have no working gas content, i.e. no Argon content. Due to the adjustability of the surface roughness and of the predominant peak, it is possible to optimize the surface area per surface unity of coated substrate for an inventive PDP-substrate, which is very desirable so as to reach high secondary electron emission coefficients. Thereby, it seems that a predominant peak at (111) is optimal. As may be seen from comparing FIG. 3, T=200° C., and FIG. 10, there apparently results at a (111)-peak a high surface roughness of about 0.5 nm RMS.

What is claimed is:

1. A method for manufacturing a substrate of at least 100×100 mm, a surface of the substrate being coated with an MgO layer, the MgO layer having a selected characteristic of (XYZ) crystal orientation, the method comprising the steps of:

sputtering off Mg in a first area by generating a plasma discharge between an Mg cathode sputtering target with an Mg material purity of at least 99% and an anode, in an atmosphere of said first area with a working gas;

flowing said working gas out of said first area and into a second area adjacent said surface;

introducing oxygen into said second area; and selecting said sputtering, said flowing and said introducing steps so that said MgO layer is deposited with a static deposition rate of at least 5 nm/sec and said MgO layer is deposited having a density of at least 85% of the density of stoichiometric MgO-bulk material, which latter is $\rho=3.58$ g/cm$^3$.

2. The method of claim 1, further comprising defining said first area by two cathode sputtering targets of said Mg, facing each other and mutually defining a slit.

3. The method of claim 2, further comprising the step of generating said plasma discharge between both cathode sputtering targets and said anode.

4. The method of claim 1, further comprising generating said plasma discharge by applying an electrical signal to said cathode sputtering target and said anode which comprises DC.

5. The method of claim 2, further comprising defining said second space by an end of said slit and said surface, thereby positioning said surface spaced from and substantially parallel to said end.

6. The method of claim 1, further comprising selecting said selected characteristic to be a degree of (111), (200) and (220) crystal orientation.

7. The method of claim 1, further comprising the step of moving said substrate with said surface substantially perpendicularly to a direction of flowing said working gas into said second area.

8. The method of claim 7, further comprising moving said substrate with said surface linearly.

9. The method of claim 8, further comprising the step of moving said substrate with said surface at a constant speed.

10. The method of claim 1, further comprising selecting a dynamic deposition rate for said MgO layer to be at least 30 nm.m/sec.

11. The method of claim 10, further comprising the step of selecting said dynamic deposition rate to be at least 35 nm.m/sec.

12. The method of claim 1, further comprising the step of selecting said selected characteristic with respect to height and angular position of (XYZ) peaks.

13. The method of claim 1, further comprising selecting said characteristic to have a predominant peak at (111).

14. The method of claim 13, wherein said (111) peak is the only peak of said characteristic.

15. The method of claim 1 for manufacturing said substrate with an MgO layer having an index of refraction n for a spectral range of light of at least 400 nm to 800 nm, which is $$1.6 \leq n \leq 1.8.$$

16. The method of claim 15, wherein said index n is:

$$1.65 \leq n \leq 1.75.$$

17. The method of claim 16, wherein there is valid for said n:

$$1.65 \leq n \leq 1.7.$$

18. The method of claim 15, wherein said range is selected to be at least 350 nm to 820 nm.

19. The method of claim 1 for manufacturing said substrate, wherein said MgO layer has a surface roughness which is homogeneously distributed along said surface and which is in the range of 0.2 nm RMS to 0.5 nm RMS, measured by means of AFM.

20. The method of claim 1, wherein said MgO layer density is at least 90% of said density of MgO-bulk material.

21. The method of claim 1 for manufacturing a substrate with said layer comprising stoichiometric MgO.

22. The method of claim 21, wherein said layer consists of stoichiometric MgO.

23. The method of claim 1 for manufacturing a plasma display panel.

24. The method of claim 1, wherein said plasma display panel has a glass substrate.

* * * * *